US009331104B2

(12) United States Patent
Park et al.

(10) Patent No.: US 9,331,104 B2
(45) Date of Patent: May 3, 2016

(54) ARRAY SUBSTRATE FOR DISPLAY DEVICE

(71) Applicant: LG DISPLAY CO., LTD., Seoul (KR)

(72) Inventors: Jungsoo Park, Goyang-si (KR); Jongseok Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/558,379

(22) Filed: Dec. 2, 2014

(65) Prior Publication Data

US 2015/0279868 A1 Oct. 1, 2015

(30) Foreign Application Priority Data

Mar. 27, 2014 (KR) ........................ 10-2014-0036185

(51) Int. Cl.
*H01L 23/62* (2006.01)
*H01L 27/12* (2006.01)
*G02F 1/1362* (2006.01)
*G02F 1/1368* (2006.01)
*H01L 27/02* (2006.01)
*G02F 1/1333* (2006.01)

(52) U.S. Cl.
CPC .......... *H01L 27/1244* (2013.01); *G02F 1/1368* (2013.01); *G02F 1/133351* (2013.01); *G02F 1/136204* (2013.01); *H01L 27/0292* (2013.01); *H01L 27/1248* (2013.01); *G02F 2201/50* (2013.01)

(58) Field of Classification Search
CPC ............ H01L 21/043; H01L 21/02175; H01L 21/28078; H01L 28/60; H01L 28/65; H01L 29/4908; H01L 29/6603; H01L 51/102; H01L 51/5296; H01L 51/5287; H01L 51/0508; H01L 27/3251; H01L 27/1463; H01L 27/3262; H01L 27/14667; H01L 27/1251; H01L 27/124; H01L 27/3211
USPC ........... 257/40, 13, 59, 79, 88, 152, 272, 288, 257/290, 292, 293, 359, 381, 439, 491, 538, 257/603, 643, 918, E21.006, E21.045, 257/E21.051, E21.053, E21.097, E21.352, 257/E21.411
See application file for complete search history.

(56) References Cited

U.S. PATENT DOCUMENTS

| | | | | |
|---|---|---|---|---|
| 7,295,279 B2 * | 11/2007 | Byun | ..................... | G02F 1/1339 349/187 |
| 7,365,824 B2 * | 4/2008 | Byun | ..................... | G02F 1/1339 349/187 |
| 7,710,534 B2 * | 5/2010 | Byun | ..................... | G02F 1/1339 349/189 |
| 2014/0184989 A1* | 7/2014 | Park | ..................... | G02F 1/13306 349/84 |

* cited by examiner

*Primary Examiner* — David Nhu
(74) *Attorney, Agent, or Firm* — Birch, Stewart, Kolasch & Birch, LLP

(57) ABSTRACT

Discussed is an array substrate for a display device, that may include a plurality of cell portions each including a display area and a non-display area except the display area, the display area having a plurality of pixels, first and second cell portions each including the plurality of cell portions, and a shorting bar surrounding the first cell portion and the second portion and disposed therebetween, wherein the display area includes pixel electrodes respectively formed in the plurality of pixels and a common electrode formed on the pixel electrodes, the common electrode being formed throughout entire the display area.

10 Claims, 7 Drawing Sheets

ARRAY SUBSTRATE FOR DISPLAY DEVICE

This application claims the priority benefit of Korean Patent Application No. 10-2014-0036185 filed on Mar. 27, 2014, which is hereby incorporated by reference for all purposes as if fully set forth herein.

BACKGROUND OF THE INVENTION

1. Field of the Invention

The present invention relates to an array substrate for a display device, and more specifically, to an array substrate for a display device, capable of preventing a defect due to static electricity charged on an electrode.

2. Discussion of the Related Art

Recently, flat panel displays (FPDs) are becoming increasingly important with the development of multimedia. Accordingly, several display devices, such as a liquid crystal display (LCD), a plasma display panel (PDP), a field emission display (FED), and an organic light emitting display (OLED) have been put to practical use. Of theses, the organic light emitting display is being considered as a next-generation display device since the organic light emitting display exhibits a high-speed response of 1 ms or less and low power consumption, and has self-light emission characteristics, causing no problems in the viewing angle.

The display device is driven in a passive matrix manner and an active matrix manner using thin film transistors. While the driving is implemented by forming positive electrodes and negative electrodes to cross each other and selecting a line according to the passive matrix manner, the driving is implemented by respectively connecting thin film transistors to pixels and maintaining a voltage through the capacitance of capacitors connected to gate electrodes of the thin film transistors.

Generally, the liquid crystal display is driven using optical anisotropy and polarization of liquid crystals. Since the liquid crystal has a thin and long structure, it has orientation in view of arrangement of liquid crystal molecules. The orientation in the arrangement of the liquid crystal molecules can be controlled by applying an electric field to the liquid crystals. Therefore, when the orientation in the arrangement of liquid crystal molecules is arbitrarily controlled, the arrangement of liquid crystal molecules are changed, the light is refracted in a direction of the arrangement of the liquid crystal molecules due to optical anisotropy to express image information.

The liquid crystal display is attracting more attention since an active matrix structure in which thin film transistors and pixel electrodes connected to the thin film transistors are arranged in a matrix type is excellent in view of resolution and video display capacity. The liquid crystal display is composed of a color filter substrate with a common electrode, an array substrate with pixel electrodes, and liquid crystals interposed between the two substrates. In this liquid crystal display, the common electrode and the pixel electrodes drive the liquid crystals by an electric field applied above and below the liquid crystals, and excellent transmittance and aperture ratio are obtained. The driving of the liquid crystals by the electric field applied above and below the liquid crystals causes a problem that the viewing angle property is not excellent.

An in-plane switching mode liquid crystal display having excellent viewing angle property has been proposed in order to solve the problem. As for the in-plane switching mode liquid crystal display, liquid crystals are driven by using a horizontal field between a pixel electrodes and a common electrode, thereby improving the viewing angle property. The electrode positioned at the top of the in-plane switching mode liquid crystal display is directly contacted with an alignment layer. The static electricity generated by a rubbing process of the alignment layer may be charged on the electrode. However, since there is no path through which the charged static electricity can be discharged from the electrodes, panel scribing is conducted while the static electricity is charged, and thus the charged static electricity is kept while the liquid crystals are driven, thereby causing a screen whitening defect at the time of the AP lighting test.

SUMMARY OF THE INVENTION

The present invention has been made in an effort to provide an array substrate for a display device, capable of preventing a defect due to static electricity charged on an electrode.

In one aspect, there is an array substrate for a display device comprising a plurality of cell portions each including a display area and a non-display area except the display area, the display area having a plurality of pixels, first and second cell portions each including the plurality of cell portions, and a shorting bar surrounding the first cell portion and the second portion and disposed therebetween, wherein the display area includes pixel electrodes respectively formed in the plurality of pixels and a common electrode formed on the pixel electrodes, the common electrode being formed throughout entire the display area, wherein the non-display area includes a driving IC part for applying a signal to the pixel electrodes and an FPC pad part for applying a signal to the display area, and wherein the common electrode of the first cell portion and the FPC pad part of the second cell portion are connected to the shorting bar.

In another aspect, there is an array substrate for a display device comprising a substrate including a display area and a non-display area, thin film transistors disposed on the display area of the substrate, a first passivation film disposed on the thin film transistors, pixel electrodes disposed on the first passivation film and connected to the thin film transistors, a second passivation film disposed on the pixel electrodes, and a common electrode and a shorting bar, which are disposed on the second passivation film, the common electrode corresponding to the display area, the shorting bar corresponding to the non-display area, wherein the common electrode is connected to the shorting bar.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Figure 1:
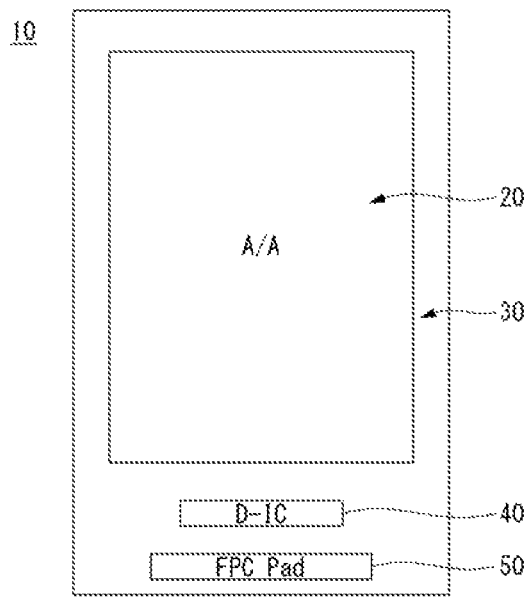
FIG. 1 is a plane view illustrating a display device according to an embodiment of the present invention.
Figure 2:
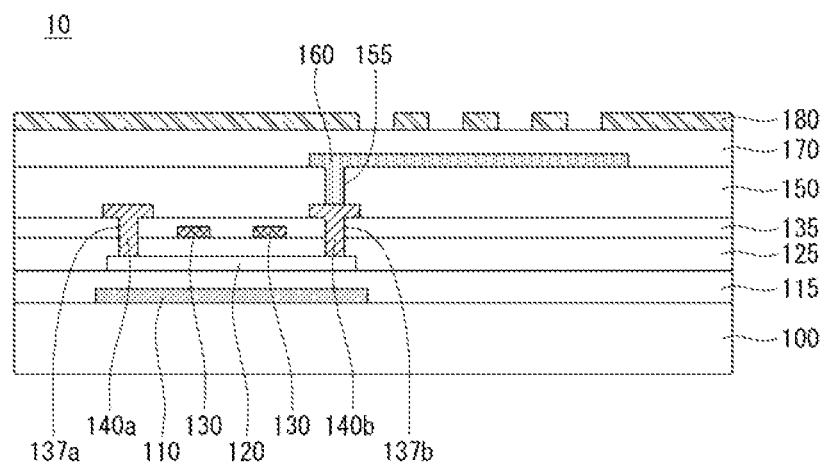
FIG. 2 is a cross-sectional view illustrating a pixel structure of a display device according to an embodiment of the present invention.

FIG. 1 is a plane view illustrating a display device according to an embodiment of the present invention; and FIG. 2 is a cross-sectional view illustrating a pixel structure of a display device according to an embodiment of the present invention.

Referring to FIG. 1, a display device according to an embodiment of the present invention will be described by exemplifying a liquid crystal display. A display device 10 according to an embodiment of the present invention includes a display area 20 and a non-display area 30. The display area 20 is an active area (A/A) in which a liquid crystal layer is formed between a thin film transistor array substrate and a color filter substrate and an image is displayed.

In the display area 20, the color filter array substrate includes a black matrix and color filters. The thin film transistor array substrate includes data lines and gate lines (or scan lines) crossing each other. As for a thin film transistor array, pixels are disposed in cell regions defined by the data lines and the gate lines, and thus arranged in a matrix type. The pixels of the display area 20 are respectively connected to thin film transistors, and driven by an electric field between pixel electrodes and a common electrode. The common electrode is formed on the color filter substrate in a vertical field driving mode, such as a twisted nematic (TN) mode and a vertical alignment (VA) mode, and is formed together with the pixel electrodes on the thin film transistor substrate in a horizontal field driving manner such as an in-plane field switching (IPS) mode or a fringe field switching (FFS) mode. The display area 20 may be implemented also in any liquid crystal mode, as well as the above-described TN mode, VA mode, IPS mode, and FFS mode, but the embodiment of the present invention will be described by exemplifying the IPS mode.

For the display area 20, a transmissive type liquid crystal display panel which modulates the light from a backlight unit may be selected. A backlight unit includes a light source which is turned on depending on the driving current supplied from a backlight unit driver, a liquid guiding plate (or a diffusion plate), and a plurality of optical sheets. The backlight unit may be implemented as a direct type backlight unit or an edge type backlight unit. The light source of the backlight unit may include any one or two or more of hot cathode fluorescent lamp (HCFL), cold cathode fluorescent lamp (CCFL), external electrode fluorescent lamp (EEFL), and light emitting diode (LED).

In the non-display area 30, a driving IC part (D-IC) 40 for applying a driving signal to the display area 20 and a flexible printed circuit (FPC) pad part 50 to which an FPC for applying an external driving signal to the driving IC part 40 are positioned. Detailed descriptions of the non-display area 30 will be set forth later.

Hereinafter, the pixel structure of a liquid crystal display of the present invention will be described with reference to FIG. 2. Referring to FIG. 2, as for a liquid crystal display 10 according to an embodiment of the present invention, a light shielding layer 110 is disposed on a substrate 100. The light shielding layer 110 serves to prevent the generation of undesired photocurrent, which is caused by the light entering a semiconductor layer disposed above the light shielding layer 110. The light shielding layer 110 is formed of a material capable of blocking light, such as carbon black. A buffer layer 115 is disposed on the light shielding layer 110, and a semiconductor layer 120 is disposed on the buffer layer 115. The semiconductor layer 120 is formed of any one of amorphous silicon, polycrystalline silicon, or metal oxide, and the polycrystalline silicon may be formed by a low-temperature poly process (LIPS).

A gate insulating film 125 is disposed on the semiconductor layer 120, and a gate electrode 130 is disposed on the gate insulating film 125. The gate electrode 130 may be formed of any one selected from aluminum (Al), chrome (Cr), molybdenum (Mo), copper (Cu), gold (Au), and titanium (Ti), and may be formed in a structure of a single layer or at least two layers. In the present invention, a double gate structure in which two gate electrodes 130 are formed for one semiconductor layer 120 is presented. However, the present invention is not limited thereto, and thus a single gate electrode may be disposed. An interlayer insulating film 135 is disposed on the gate electrode 130, and contact holes 137a and 137b pass through the gate insulating film 125 and the interlayer insulating film 135 to expose both end portions of the semiconductor layer 120. In addition, a source electrode 140a and a drain electrode 140b are disposed on the interlayer insulating film 135, and contacted with the semiconductor layer 120 through the contact holes 137a and 137b, respectively. The source electrode 140a and the drain electrode 140b are formed of any one selected from aluminum (Al), chrome (Cr), molybdenum (Mo), copper (Cu), gold (Au), and titanium (Ti). Thus, a thin film transistor (TFT) including the semiconductor 120, the gate electrode 130, the source electrode 140a, and the drain electrode 140b is configured.

A first passivation film 150 is disposed on the thin film transistor (TFT), and a via hole 155 exposing the drain electrode 140b is disposed in the first passivation film 150. The first passivation film 150 may be formed of any one selected from the silicon nitride (SiNx), silicon oxide (SiOx), and an acryl-based resin, and formed of, preferably, photo acryl (PAC) which is a kind of acryl-based resin. A pixel electrode 160 is disposed on the first passivation film 150, and connected to the drain electrode 140b of the thin film transistor TFT through the via hole 155. The pixel electrode 160 is a transparent electrode, and may be formed of any one selected from ITO, IZO, and TIZO. The pixel electrode 160 is patterned by the pixel unit and has a plate shape, and thus forms horizontal and vertical fields together with the common electrode. A second passivation film 170 is disposed on the pixel electrode 160, and a common electrode 180 is disposed on the second passivation film 170. The common electrode 180 is formed of a transparent electrode like the pixel electrode, and may be formed of any one selected from ITO, IZO, and TIZO. The common electrode 180 has a plurality of slits so as to form horizontal and vertical fields together with the pixel electrodes 160. The common electrode 180 is formed in a plate shape covering the entire display area of the liquid crystal display, instead of being patterned by the pixel unit like the pixel electrode 160. Therefore, a liquid crystal display 10 in which the pixel electrodes 160 and the common electrode 180 disposed above and below form horizontal and vertical fields is configured.

Figure 3:
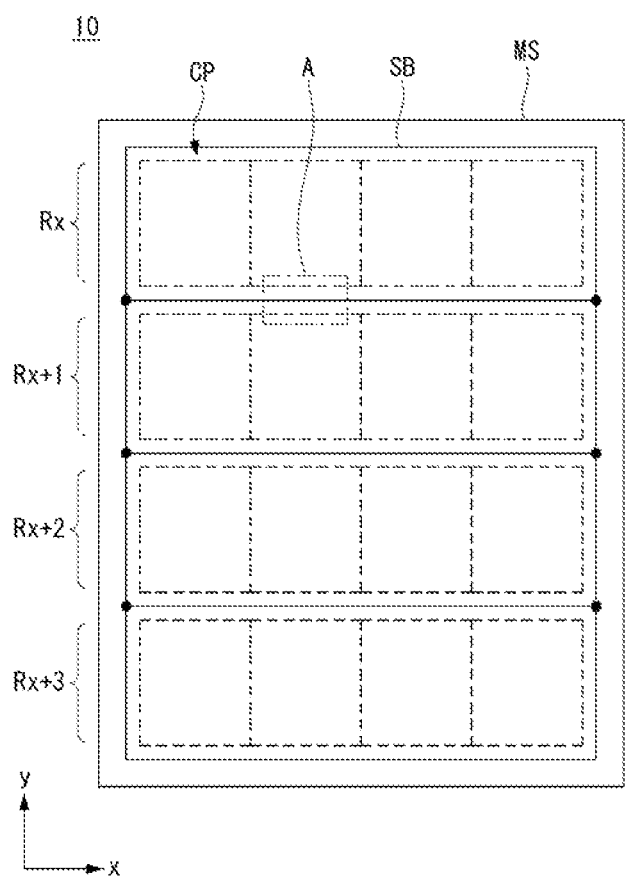
FIG. 3 is a plane view illustrating a mother substrate including an array substrate for a display substrate according to a first embodiment of the present invention.

Hereinafter, array substrates for a display device according to the foregoing embodiments of the present invention will be described. FIG. 3 is a plane view illustrating a mother substrate including an array substrate for a display substrate according to a first embodiment of the present invention; FIG.

Figure 4:
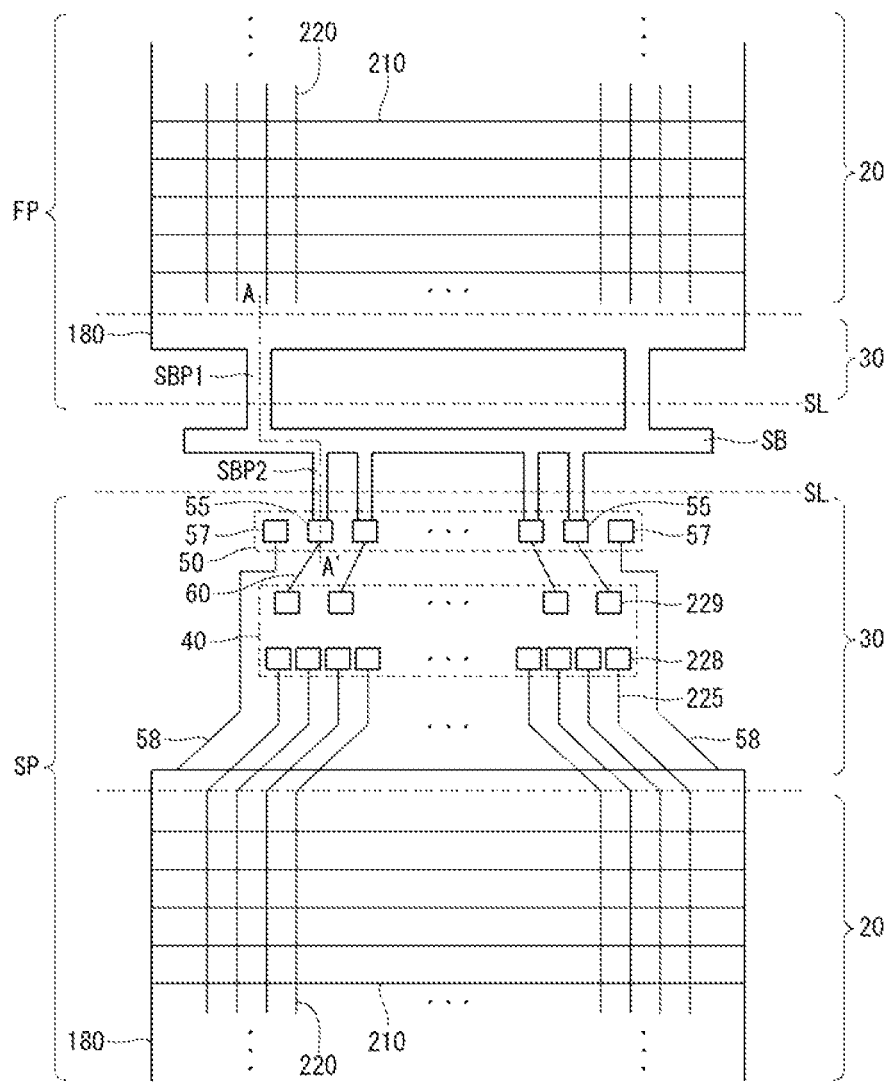
FIG. 4 is an enlarged view of region A in FIG. 3.
Figure 5:
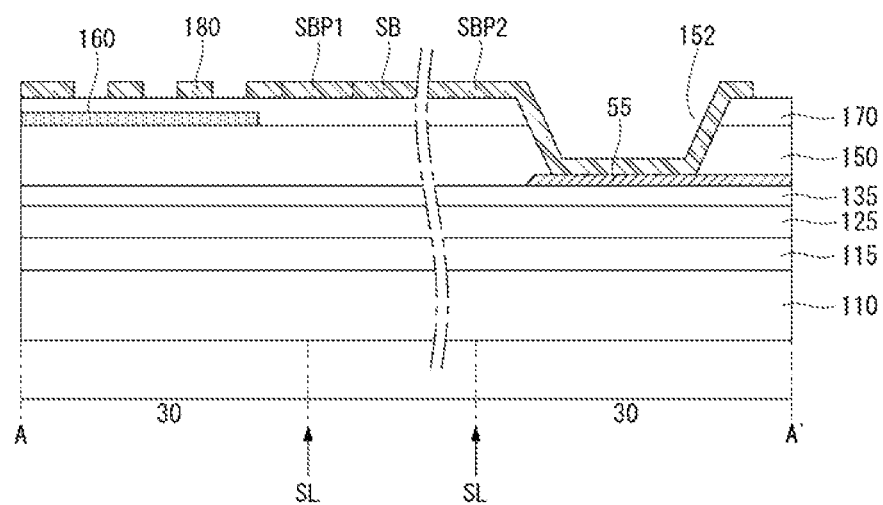
FIG. 5 is a cross-sectional view cut along line A-A' of FIG. 4.

4 is an enlarged view of region A in FIG. 3; and FIG. 5 is a cross-sectional view cut along line A-A' of FIG. 4.

Referring to FIG. 3, a mother substrate MS includes a plurality of cell portions CP each formed as a panel for a liquid crystal display. The cell portions CP are arranged on the mother substrate MS such that a plurality of rows Rx, . . . , Rx+3 adjacent to each other are arranged in an x direction. For example, each of the rows Rx, . . . , Rx+3 is composed of four cell portions. In addition, a shorting bar SB is disposed to surround the cell portions CP of the mother substrate MS, thereby discharging static electricity generating in devices of the cell portions. The shorting bar SB is disposed between the plurality of rows Rx, . . . , Rx+3 composed of the cell portions CP, and is disposed to surround both of the first row and the last row.

The connection of the cell portions CP and the shorting bar SB on the foregoing array substrate 10 for a display device will be described with reference to FIG. 4. Referring to FIG. 4, the array substrate 10 for a display device includes a first cell portion FP, a second cell portion SP, and a shorting bar SB disposed therebetween. Here, the first cell portion FP is included in a plurality of cell portions CP disposed above the shorting bar SB, and the second portion SP is included in a plurality of cell portions CP disposed below the shorting bar SB. The first cell portion FP and the second cell portion SP each include a display area 20 and a non-display area 30. In the display area 20, a plurality of pixels are defined by arranging a plurality of gate lines 210 and a plurality of data lines 220 in a matrix type. In the plurality of pixels, thin film transistors are disposed, and pixel electrodes connected to the thin film transistors and a common electrode facing the pixel electrodes are formed.

The non-display area 30 includes a driving IC part 40 and an FPC pad part 50. The driving IC part 40 is an area to which a driving IC (D-IC) is attached, and includes a plurality of first bumps 228 and a plurality of second bumps 229. The plurality of first bumps 228 are disposed to correspond to output pins of the driving IC, and connected to the plurality of data lines 220 through a plurality of data links 225 to supply signals to the display area 20. The plurality of second bumps 229 are disposed to correspond to input pins of the driving IC, and supply signals from the FPC pad part 50 to the driving IC. The driving IC serves to supply a data signal to the display area in response to a timing signal and a data image signal supplied from the outside, and may generate a separate timing signal, besides the timing signal supplied from the outside, and may generate or supply a gate driving signal.

The FPC pad part 50 is an area to which a flexible printed circuit (FPC) is attached in a module process, and includes a plurality of third bumps 55 and fourth bumps 57. The plurality of third bumps 55 are connected to the flexible printed circuit to supply signals to the second bumps 229 through driving links 60. The plurality of fourth bumps 57 are connected to the flexible printed circuit, and supply a signal to the common electrode 180 formed in the display area 20 through a common wire 58. A separate common wire 58 may be connected to the common electrode 180, but the separate common wire may be omitted.

The shorting bar SB is disposed between the plurality of cell portions CP, for example between the first cell portion FP and a second cell portion SP. The shorting bar SB includes a first branch part of the shorting bar SBP1 and a second branch part of the shorting bar SBP2. The first branch part of the shorting bar SBP1 connects the common electrode 180 of the first cell portion FP to the shorting bar SB, and the second branch part of the shorting bar SBP2 connects the third bumps 55 of the FPC pad part 50 of the second cell portion SP to the shorting bar SB. The first branch part of the shorting bar SBP1 is branched from the shorting bar SB and connected with the common electrode 180 of the first cell portion FP, and the second branch part of the shorting bar SBP2 is branched from the shorting bar SB and connected with the third bumps 55 of the second cell portion SP. Here, the first branch part of the shorting bar SBP1 and the second branch part of the shorting bar SBP2 are formed of the same material as the shorting bar SB as one body, and are formed of the same material as the common electrode 180 as one body.

The first branch part of the shorting bar SBP1 serves as a discharging path of static electricity generated in the common electrode 180. In particular, the static electricity generated by a friction between the common electrode 180 and a rubbing cloth in a rubbing process is led to the shorting bar SB through the first branch part of the shorting bar SBP1 and then discharged to the outside. If the static electricity charged on the common electrode 180 cannot escape out, a panel scribing process is conducted while the static electricity is charged, and thus the charged static electricity is kept while the liquid crystals are driven, thereby causing a screen whitening defect at the time of the AP lighting test. Therefore, the common electrode 180 is connected to the shorting bar SB to allow the static electricity to be discharged. Accordingly, at least one first branch part of the shorting bar SBP1 is formed from the common electrode 180, but at least two first branch parts of the shorting bar SBP1 are formed to efficiently discharge static electricity.

Hereinafter, the cross-sectional structure of the common electrode 180 of the first cell portion FP, the shorting bar SB, and the FPC pad part 50 of the second cell portion SP will be described. Referring to FIG. 5, following the description of FIG. 2, the third bump 55 is disposed in the second cell portion SP of the substrate 110, on which the buffer layer 115, the gate insulating film 125, and the interlayer insulating film 135 are stacked. The third bump 55 is formed of the same material as the source electrode and the drain electrode of the thin film transistor. In addition, the first passivation film 150 is disposed above the entire surface of the substrate 110, and the pixel electrode 160 is disposed in the display area of the first cell portion FP. The first passivation film 170 is disposed above the substrate 110 provided with the pixel electrode 160 is disposed, and the common electrode 180, the first branch part of the shorting bar SBP1, the shorting bar SB, and the second branch part of the shorting bar SBP2 are disposed on the first second passivation film. Here, all of the common electrode 180, the first branch part of the shorting bar SBP1, the shorting bar SB, and the second branch part of the shorting bar SBP2 are simultaneously formed of the same material. Therefore, all of the common electrode 180, the first branch part of the shorting bar SBP1, the shorting bar SB, and the second branch part of the shorting bar SBP2 are formed as one body. The second branch part of the shorting bar SBP2 disposed in the second cell portion SP is connected to the third bump 55 through an opening 152 exposing the first passivation film 150 and the second passivation film 170.

Again referring to FIG. 4, the mother substrate having the plurality of array substrates 10 for a display device including the shorting bar SB with the first branch part of the shorting bar SBP1 and the second branch part of the shorting bar SBP2 is bound to the color filter array substrate and then liquid crystals are injected therebetween in a subsequent cell process. After that, scribing is conducted by the cell unit, thereby forming unit panels. The shorting bar SB formed in the array substrate 10 for a display device is scribed along a scribing line SL to cut the first branch part of the shorting bar SBP1 and the second branch part of the shorting bar SBP2. Here, the scribing line SL is formed to cross the first branch part of the shorting bar SBP1 and the second branch part of the shorting bar SBP2. Therefore, as for the finally scribed array substrate 10 for a display device, the first branch part of the shorting bar SBP1 and the second branch part of the shorting bar SBP2 are partially left in the non-display area 30. The scribed unit panel scribed goes through a module process including the attaching of the flexible printed circuit and the driving IC and the assembling of the backlight unit, thereby completing a display device.

As described above, the array substrate for a display device according to the first embodiment of the present invention can prevent a screen whitening defect at the time of the AP lighting test due to static electricity charged on the common electrode, by connecting the common electrode to the shorting bar in a structure in which the common electrode is formed above the pixel electrode.

Figure 6:
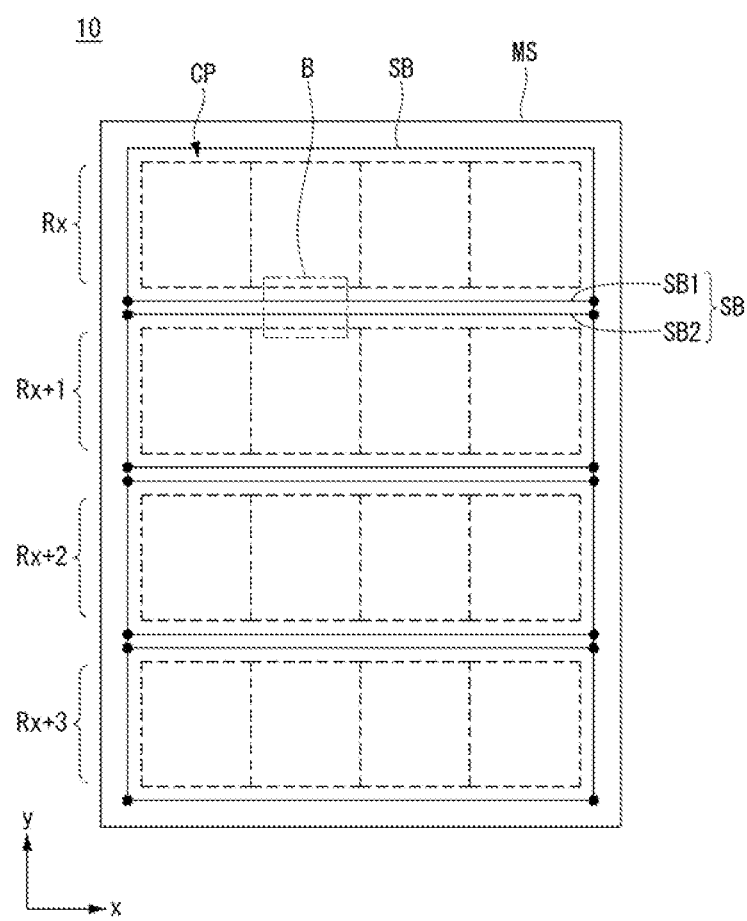
FIG. 6 is a plane view illustrating a mother substrate including an array substrate for a display substrate according to a second embodiment of the present invention.
Figure 7:
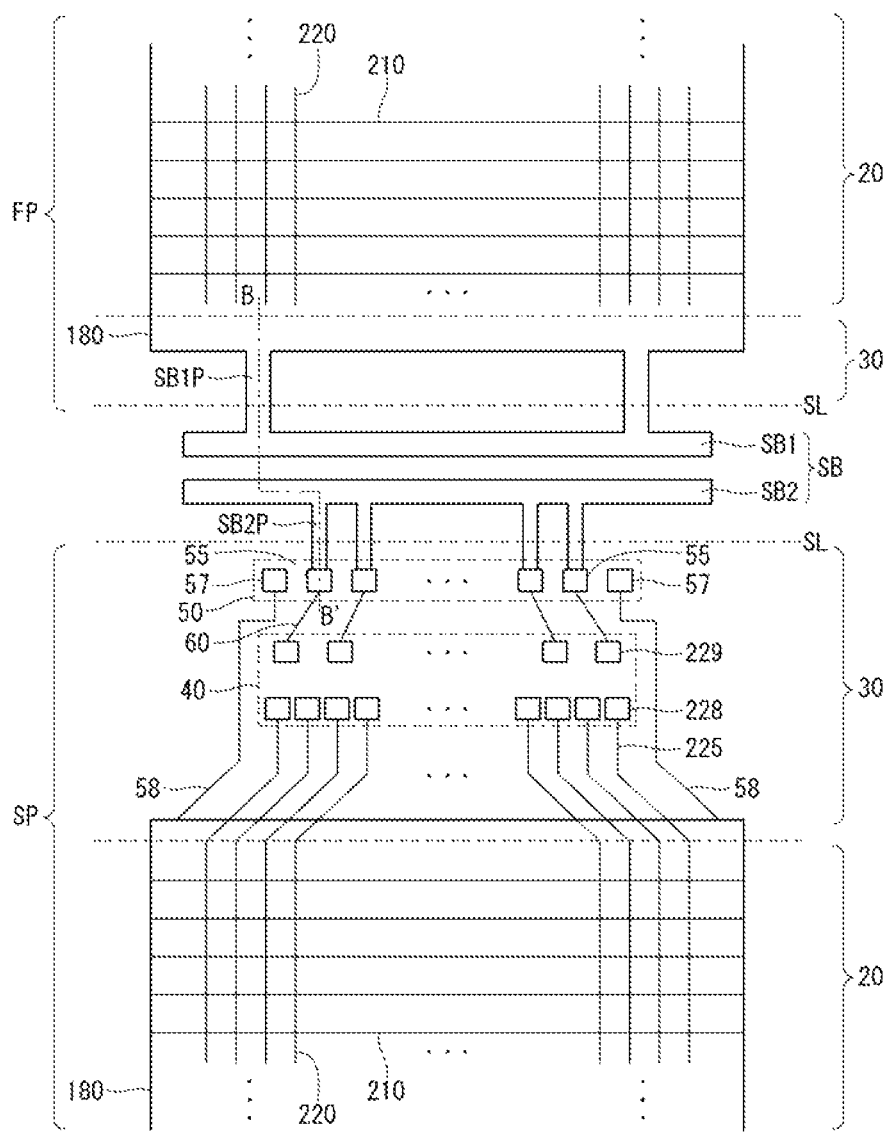
FIG. 7 is an enlarged view of region B in FIG. 6.
Figure 8:
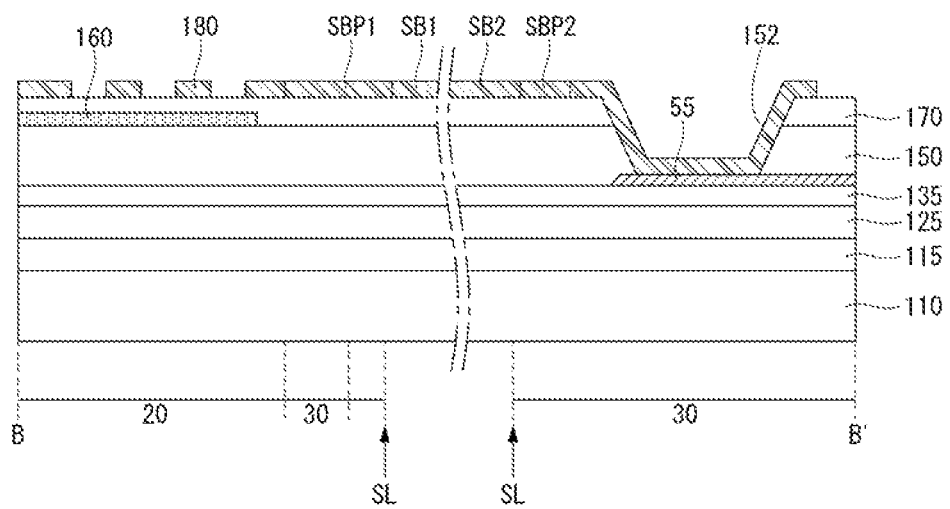
FIG. 8 is a cross-sectional view cut along line B-B' of FIG. 7.

Hereinafter, an array substrate for a display device according to a second embodiment of the present invention will be described. In the following description, the same reference numerals are used to designate the same components as the first embodiment, and descriptions thereof are simplified. FIG. 6 is a plane view illustrating a mother substrate including an array substrate for a display substrate according to a first embodiment of the present invention; FIG. 7 is an enlarged view of region B in FIG. 6; and FIG. 8 is a cross-sectional view cut along line B-B' of FIG. 7.

Referring to FIG. 6. a mother substrate MS includes a plurality of cell portions CP, and the cell portions CP are arranged such that a plurality of rows Rx, . . . , Rx+3 adjacent to each other are arranged in an x direction. In addition, a shorting bar SB is disposed to surround the cell portions CP of the mother substrate MS to discharge static electricity generating in devices of the cell portions. The shorting bar SB is disposed between the plurality of rows Rx, . . . , Rx+3 composed of the cell portions CP, and is disposed to surround both of the first row and the last row. Unlike the foregoing first embodiment, a firs shorting bar SB1 and a second shorting bar SB2 are disposed between the first row Rx and the second row Rx+1.

More specifically, referring to FIG. 7, the array substrate 10 for a display device includes a first cell part FP, a second cell part SP, and the first shorting bar SB1 and the second shorting bar SB2 disposed therebetween. Here, the first cell portion FP corresponds to a plurality of cell portions CP disposed above the first shorting bar SB1 and the second shorting bar SB2, and the second portion SP corresponds to a plurality of cell portions CP disposed below the first shorting bar SB1 and the second shorting bar SB2.

The first shorting bar SB1 and the second shorting bar SB2 are disposed between the first cell portion FP and the second cell portion SP. The first shorting bar SB1 includes a first shorting bar branch part SB1P for connecting the common electrode 180 to the first shorting bar SB1, and the second shorting bar SB2 includes a second shorting bar branch part SB2P for connecting the FPC pad part 50 of the second cell portion SP to the second shorting bar SB2. The first shorting bar branch part SB1P is branched from the first shorting bar SB1 and connected with the common electrode 180 of the first cell portion FP, and the second shorting bar branch part SB2P is branched from the second shorting bar SB2 and connected with the third bumps 55 of the second cell portion SP. Here, the first shorting bar branch part SB1P and the second shorting bar branch part SB2P are formed of the same material as the first shorting bar SB1 and the second shorting bar SB2 as one body, and are formed of the same material as the common electrode 180 as one body.

The first shorting bar branch part SB1P serves as a discharging path of static electricity generated in the common electrode 180. In particular, the static electricity generated by a friction between the common electrode 180 and a rubbing cloth in a rubbing process is led to the first shorting bar SB1 through the first shorting bar branch part SB1P and then discharged to the outside. If the static electricity charged on the common electrode 180 cannot escape out, a panel scribing process is conducted while the static electricity is charged, and thus the charged static electricity is kept while the liquid crystals are driven, thereby causing a screen whitening defect at the time of the AP lighting test. Therefore, the common electrode 180 is connected to the first shorting bar SB1 to allow the static electricity to be discharged. Accordingly, at least one first shorting bar branch part SB1P is formed from the common electrode 180, but at least two first shorting bar branch parts SB1P are formed to efficiently discharge static electricity.

Hereinafter, the cross-sectional structure of the common electrode 180 of the first cell portion FP, the first shorting bar SB1, the second shorting bar SB2, and the FPC pad part 50 of the second cell portion SP will be described. Referring to FIG. 8, following the description of FIG. 2, the third bump 55 is disposed in the second cell portion SP of the substrate 110, on which the buffer layer 115, the gate insulating film 125, and the interlayer insulating film 135 are stacked. The third bump 55 is formed of the same material as the source electrode and the drain electrode of the thin film transistor. In addition, the first passivation film 150 is disposed over the entire surface of the substrate 110, and the pixel electrode 160 is disposed in the display area of the first cell portion FP. A first passivation film 170 is disposed above the first substrate 110 above which the pixel electrode 160 is formed. The common electrode 180, the first shorting bar branch part SB1P, the first shorting bar SB1, the second shorting bar SB2, and the second shorting bar branch part SB2P are disposed on the first passivation film 170. Here, the common electrode 180, the first shorting bar branch part SB1P, the first shorting bar SB1, the second shorting bar SB2, and the second shorting bar branch part SB2P are simultaneously formed of the same material. Therefore, the common electrode 180, the first shorting bar branch part SB1P, the first shorting bar SB1, the second shorting bar SB2, and the second shorting bar branch part SB2P are formed as one body. The second shorting bar branch part SBP2 disposed in the second cell portion SP is connected to the third bump 55 through an opening 152 exposing the first passivation film 150 and the second passivation film 170.

Again referring to FIG. 7, the mother substrate having the plurality of array substrates 10 for a display device including the first shorting bar SB1 with the first shorting bar branch part SB1P and the second shorting bar SB2 with the second shorting bar branch part SB2P is bound to the color filter array substrate and then liquid crystals are injected therebetween in a subsequent cell process. After that, scribing is conducted by the cell unit, thereby forming unit panels. The shorting bar SB formed in the array substrate 10 for a display device is scribed along a scribing line SL to cut the first shorting bar branch part SB1P and the second shorting bar branch part SB2P. Therefore, as for the finally scribed array substrate 10 for a display device, the first shorting bar branch part SBP1 and the second shorting bar branch part SBP2 are partially left in the non-display area 30. The scribed unit panel goes through a module process including the attaching of the flexible printed circuit and the driving IC and the assembling of the backlight unit.

As described above, the array substrate for a display device according to the second embodiment of the present invention can prevent a screen whitening defect at the time of the AP lighting test due to static electricity charged on the common electrode, by connecting the common electrode to the shorting bar in a structure in which the common electrode is formed above the pixel electrode.

In the array substrates for a display device according to the first embodiment and the second embodiment of the present invention as described above, the screen whitening defect occurring at the AP lighting test can be completely improved from 56.3% in the prior art to 0% in the present invention.

The array substrates for a display device according to the embodiments of the present invention can prevent a screen whitening defect at the time of the AP lighting test due to static electricity charged on the common electrode, by connecting the common electrode to the shorting bar in a structure in which the common electrode is formed above the pixel electrode.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An array substrate for a display device, the array substrate comprising:
   a plurality of cell portions each including a display area and a non-display area except the display area, the display area having a plurality of pixels;
   first and second cell portions each including the plurality of cell portions; and
   a shorting bar surrounding the first cell portion and the second portion and disposed therebetween,
   wherein the display area includes pixel electrodes respectively formed in the plurality of pixels and a common electrode formed on the pixel electrodes, the common electrode being formed entire the display area,
   wherein the non-display area includes a driving integrated circuit (IC) part for applying a signal to the pixel electrodes and a flexible printed circuit (FPC) pad part for applying a signal to the display area, and
   wherein the common electrode of the first cell portion and the FPC pad part of the second cell portion are connected to the shorting bar.

2. The array substrate of claim 1, wherein the first cell portion is positioned above the shorting bar and the second cell portion is positioned below the shorting bar.

3. The array substrate of claim 1, wherein the common electrode and the shorting bar are formed as one body.

4. The array substrate of claim 1, wherein the shorting bar includes a first branch part of the shorting bar and a second branch part of the shorting bar, the first branch part of the shorting bar connecting the common electrode of the first cell portion to the shorting bar, the second branch part of the shorting bar connecting the FPC pad part of the second cell portion to the shorting bar.

5. The array substrate of claim 1, wherein the shorting bar includes a first shorting bar and a second shorting bar, and
   wherein the common electrode of the first cell portion is connected to the first shorting bar and the FPC pad part of the second cell portion is connected to the second shorting bar.

6. The array substrate of claim 5, wherein the first shorting bar and the second shorting bar are arranged adjacent to and in parallel with each other.

7. The array substrate of claim 6, wherein the first shorting bar includes a first shorting bar branch part and the second shorting bar includes a second shorting bar branch part, the first shorting bar branch part connecting to the common electrode of the first cell portion to the first shorting bar, the second shorting bar branch part connecting the FPC pad part of the second cell portion to the second shorting bar.

8. An array substrate for a display device, the array substrate comprising:
   a substrate including a display area and a non-display area;
   thin film transistors disposed on the display area of the substrate;
   a first passivation film disposed on the thin film transistors;
   pixel electrodes disposed on the first passivation film and connected to the thin film transistors;
   a second passivation film disposed on the pixel electrodes; and
   a common electrode and a shorting bar, which are disposed on the second passivation film, the common electrode corresponding to the display area, the shorting bar corresponding to the non-display area,
   wherein the common electrode is connected to the shorting bar, and
   wherein the shorting bar includes a first branch part of the shorting bar and a second branch part of the shorting bar, the first branch part of the shorting bar connecting the common electrode to the shorting bar, the second branch part of the shorting bar connecting a flexible printed circuit (FPC) pad part disposed in the non-display area to the shorting bar.

9. The array substrate of claim 8, wherein the common electrode and the shorting bar are formed as one body.

10. The array substrate of claim 8, wherein the pixel electrodes are formed for different pixels formed in the display area, and the common electrode is formed throughout the display area.

* * * * *